(12) United States Patent
Cho et al.

(10) Patent No.: US 8,120,010 B2
(45) Date of Patent: Feb. 21, 2012

(54) QUANTUM DOT ELECTROLUMINESCENT DEVICE AND METHOD FOR FABRICATING THE SAME

(75) Inventors: Kyung Sang Cho, Gwacheon-si (KR); Byoung Lyong Choi, Seoul (KR); Eun Kyung Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/534,226

(22) Filed: Aug. 3, 2009

(65) Prior Publication Data
US 2010/0108984 A1 May 6, 2010

(30) Foreign Application Priority Data
Nov. 5, 2008 (KR) .................. 10-2008-0109480

(51) Int. Cl.
*H01L 29/06* (2006.01)
*H01L 31/00* (2006.01)
(52) U.S. Cl. ............ 257/13; 257/12; 257/94; 257/103; 257/E33.013; 438/38; 438/45
(58) Field of Classification Search ............ 257/12, 257/13, 94, E33.013; 438/38, 45
See application file for complete search history.

(56) References Cited

U.S. PATENT DOCUMENTS

| 7,306,823 | B2 | 12/2007 | Sager et al. | |
|---|---|---|---|---|
| 2003/0003300 | A1* | 1/2003 | Korgel et al. | 428/402 |
| 2004/0265478 | A1* | 12/2004 | Sadasivan et al. | 427/64 |
| 2007/0174939 | A1 | 7/2007 | Sargent et al. | |
| 2009/0211629 | A1* | 8/2009 | Williams et al. | 136/256 |

FOREIGN PATENT DOCUMENTS

| KR | 1020040059588 | 7/2004 |
|---|---|---|
| KR | 1020060100151 | 9/2006 |
| KR | 1020070082385 | 8/2007 |

* cited by examiner

*Primary Examiner* — Jarrett Stark
(74) *Attorney, Agent, or Firm* — Cantor Colburn LLP (57) ABSTRACT

A quantum dot electroluminescent device that includes a substrate, a quantum dot light-emitting layer disposed on the substrate, a first electrode which injects charge carriers into the quantum dot light-emitting layer, a second electrode which injects charge carriers, which have an opposite charge than the charge carriers injected by the first electrode, into the quantum dot light-emitting layer, a hole transport layer disposed between the first electrode and the quantum dot light-emitting layer, and an electron transport layer disposed between the second electrode and the quantum dot light-emitting layer, wherein the quantum dot light-emitting layer has a first surface in contact with the hole transport layer and a second surface in contact with an electron transport layer, and wherein the first surface has an organic ligand distribution that is different from an organic ligand distribution of the second surface.

5 Claims, 5 Drawing Sheets

FIG. 5

QUANTUM DOT ELECTROLUMINESCENT DEVICE AND METHOD FOR FABRICATING THE SAME

CROSS-REFERENCE TO RELATED APPLICATION

This application claims priority to Korean Patent application No. 10-2008-109480, filed on Nov. 5, 2008, and all the benefits accruing therefrom under 35 U.S.C. §119, the contents of which in its entirety are herein incorporated by reference.

BACKGROUND

1. Field

The following description relates to a quantum dot electroluminescent device and a method for fabricating a quantum dot electroluminescent device. In exemplary embodiments, the quantum dot electroluminescent device has a low turn-on voltage and a low operating voltage while exhibiting high brightness and high luminescence efficiency.

2. Description of the Related Art

A quantum dot is a crystalline semiconductor material having a size of about a few nanometers and consists of about several hundred to about several thousand atoms. The small size of a quantum dot results in a large surface area per unit volume. This allows most of the constituent atoms to be exposed to the surface, and gives rise to various effects, including quantum confinement. By taking advantage of the quantum confinement effect, the emission wavelength of the quantum dots may be controlled by varying the size of the quantum dots. Further, quantum dots have received a great deal of attention in the display arts for their advantages such as good color purity and high photoluminescence ("PL") efficiency.

A quantum dot electroluminescent ("QD-EL") device has a three-layer structure, as the basic structure, in which a quantum dot light-emitting layer is interposed between a hole transport layer ("HTL") and an electron transport layer ("ETL").

A conventional organic light-emitting diode ("OLED") includes a HTL and a light-emitting layer. The hole transport layer ("HTL") is formed of a material having a highest occupied molecular orbital ("HOMO") level of between 5.0 and 5.3 eV. The light-emitting layer is formed of a material having a HOMO level of between 5.0 and 5.5 eV. The small difference in the HOMO levels between the light-emitting layer and the HTL allows for the efficient transport of holes through the layers to ensure high efficiency of the device.

However, a large band offset between the valence band level (about 6.8 eV) of the quantum dots used in the QD-EL device and the HOMO level of the HTL material used in the OLED may result in problems with the QD-EL device. This may cause problems relating to the turn-on voltage, the operating voltage, the overall efficiency, the carrier injection efficiency, etc. of the QD-EL device.

In an attempt to resolve these problems, a method has been considered for controlling the HOMO level of the HTL or for selecting a suitable HTL material that is capable of reducing the band offset between the HTL layer and the quantum dot ("QD") layer. However, there are few known HTL materials that have a HOMO level as high as 5.4 eV. Further, the use of a HTL material having a HOMO level of 5.4 eV or above causes a large band offset between a HTL and an indium-tin oxide ("ITO") anode, making the migration of holes throughout the layer difficult.

Under such circumstances, there is a need to develop a method that uses an HTL material that has excellent physical properties. There is a further need to develop a method that uses an HTL material that controls the band level of a QD light-emitting layer in order to lower the turn-on voltage and the operating voltage of a QD-EL device while improving the carrier injection efficiency of the QD-EL device.

SUMMARY

In one exemplary embodiment, there is provided a quantum dot electroluminescent ("QD-EL") device which includes a substrate, a quantum dot ("QD") light-emitting layer disposed on the substrate, a first electrode which injects charge carriers into the QD light-emitting layer, a second electrode which injects charge carriers, which have an opposite charge than the charge carriers injected by the first electrode, into the QD light-emitting layer, a hole transport layer ("HTL") disposed between the first electrode and the QD light-emitting layer, and an electron transport layer ("ETL") disposed between the second electrode and the QD light-emitting layer, wherein the QD light-emitting layer has a first surface in contact with the HTL and a second surface in contact with the ETL, and wherein the first surface has an organic ligand distribution that is different from an organic ligand distribution of the second surface.

In another exemplary embodiment, there is provided a method for fabricating a QD-EL device which includes disposing a first electrode and a HTL on a substrate, disposing a QD coating on the HTL and modifying the surface of the QD coating to form a QD light-emitting layer having a first surface in contact with the HTL and a second surface opposite the first surface, wherein the first surface has an organic ligand distribution that is different from that of the second surface, and disposing an ETL on the QD light emitting layer and disposing a second electrode on the electron transport layer.

BRIEF DESCRIPTION OF THE DRAWINGS

These and/or other aspects, advantages, and features of exemplary embodiments of the invention will become apparent and more readily appreciated from the following description of the embodiments, taken in conjunction with the accompanying drawings of which.

DETAILED DESCRIPTION

The invention now will be described more fully hereinafter with reference to the accompanying drawings, in which embodiments of the invention are shown. The invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the invention are described herein with reference to cross section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the invention.

Hereinafter, the invention will be described in detail with reference to the accompanying drawings.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Unless otherwise defined, the terms 'alkyl' and 'aryl' used herein mean C1-C22 alkyl and C6-C30 aryl, respectively.

In one exemplary embodiment, there is provided a quantum dot electroluminescent ("QD-EL") device which includes a substrate, a quantum dot ("QD") light-emitting layer disposed on, e.g., supported by, the substrate, a first electrode and a second electrode connected to an external power source to inject carriers into the QD light-emitting layer, wherein the charge carriers injected by the first and second electrodes may respectively have opposite charges, a hole transport layer ("HTL") disposed between the first electrode and the QD light-emitting layer, and an electron transport layer ("ETL") disposed between the second electrode and the QD light-emitting layer, wherein the QD light-emitting layer has a first surface in contact with the HTL and a second surface in contact with the ETL, and wherein the first surface has an organic ligand distribution that is different from an organic ligand distribution of the second surface.

Figure 1:
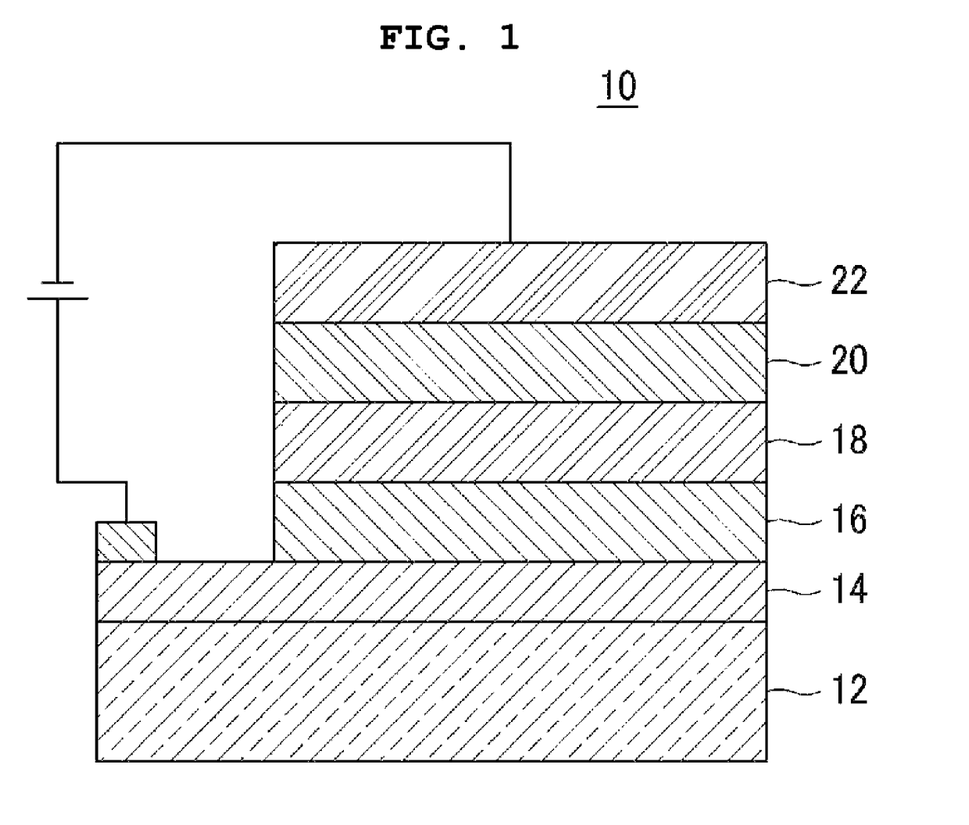
FIG. 1 is a schematic diagram illustrating an exemplary embodiment of a quantum dot electroluminescent ("QD-EL") device.

A schematic diagram of an exemplary embodiment of the QD-EL device is illustrated in FIG. 1.

Referring to FIG. 1, in exemplary embodiments, the QD-EL device 10 includes a substrate 12, a QD light-emitting layer 18 supported on the substrate 12, and a first electrode 14, herein described as an anode, and a second electrode 22, herein described as a cathode. The first electrode and the second electrode are connected to an external power source that injects carriers into the QD light-emitting layer 18. An HTL 16 is positioned between the QD light-emitting layer 18 and the first electrode 14, and an ETL 20 is positioned between the QD light-emitting layer 18 and the second electrode 22.

Unlike in FIG. 1, alternative exemplary embodiments include configurations wherein the first electrode 14 may be a cathode and the second electrode 22 may be an anode. In such an alternative exemplary embodiment, the cathode electrode, the ETL, the QD light-emitting layer, the HTL and the anode electrode may be disposed in this order on the substrate. Alternative exemplary embodiments include configurations wherein the electrodes and electron and hole transporting layers may be formed in other configurations.

In another exemplary embodiment, the substrate 12 may be made of a transparent glass or a flexible plastic. In exemplary embodiments, the plastic substrate may be made of a resin selected from the group consisting of, but not limited to, polyalkylene terephthalates, such as polyethylene terephthalate and polybutylene terephthalate; polyalkylene naphthalates, such as polyethylene naphthalate; polycarbonate; polyolefins, such as polypropylene and polyethylene; polybutene; polybutadiene; polyalkylpentenes, such as polymethylpentene; polyvinylchloride; triacetyl cellulose; polyethersulfone; polyurethane; polyalkylene vinyl acetates, such as polyethylene vinyl acetate; ionomer resins; alkylene-(meth)acrylic acid copolymers, such as ethylene-(meth)acrylic acid copolymers; alkylene-(meth)esther acrylate copolymers, such as ethylene-(meth)esther acrylate copolymers; polystyrene; polyimide; polyamide; polyamideimide; fluorine resins; any copolymers thereof; and any mixtures thereof.

In another exemplary embodiment, the first electrode 14 may be made of a high work function material to facilitate the injection of holes into the ETL 20.

In exemplary embodiments, the high work function material may be a transparent oxide, exemplary embodiments of which include indium tin oxide ("ITO"), indium zinc oxide ("IZO") or indium oxide. In exemplary embodiments, the first electrode 14 can be formed on the substrate 12 by a dry deposition process such as sputtering or other similar processes.

In another exemplary embodiment, the HTL ("HTL") 16 that is positioned on the first electrode 14 may be formed of a p-type semiconductor. Exemplary embodiments of the p-type semiconductor include poly(3,4-ethylene dioxythiophene) ("PEDOT"), poly(4-styrenesulfonate) ("PSS"), poly(phenylene vinylene) ("PPV", Formula 1), poly[2-methoxy-5-(2'-ethylhexyloxy)-1,4-phenylenevinylene] ("MEH-PPV", Formula 2), poly(9-vinlycarbazole) ("PVK", Formula 3), poly [(9,9-dialkylfluorenyl-2,7-diyl)-co-(4,4'-(N-(4-sec-alkylphenyl))diphenylamine)] such as poly[(9,9-dioctylfluorenyl-2,7-diyl)-co-(4,4'-(N-(4-sec-butylphenyl)) diphenylamine)] ("TFB", Formula 4), poly[(9,9-dialkylfluoren-2,7-diyl)-co-(N,N'-diphenyl)-N,N'-di-(p-alkylphenyl)-1,4-diaminobenzene)] such as poly[(9,9-dioctylfluoren-2,7-diyl)-co-(N,N'-diphenyl)-N,N'-di-(p-butylphenyl)-1,4-diaminobenzene)] ("PFB", Formula 5), poly [N,N'-diphenyl-N,N'-bis(3-alkylphenyl)-1,1'-biphenyl-4,4'-diamine] such as poly[N,N'-diphenyl-N,N'-bis(3-methylphenyl)-1,1'-biphenyl-4,4'-diamine] ("poly-TPD", Formula 6), and any combinations thereof.

Formula 1

Formula 2 wherein $R_1$ is a $C_1$-$C_6$ alkoxy (e.g., methoxy) and $R_2$ is a $C_1$-$C_{15}$ alkoxy (e.g., $OCH_2CH(C_2H_5)(C_4H_9)$), Formula 3

Formula 4 wherein $R_3$ and $R_4$ are each independently a $C_1$-$C_{12}$ alkyl (e.g., octyl) and $R_5$ is a $C_1$-$C_{12}$ alkyl (e.g., sec-butyl), Formula 5 wherein $R_6$ and $R_7$ are each independently a $C_1$-$C_{12}$ alkyl (e.g., octyl) and $R_8$ and $R_9$ are each independently a $C_1$-$C_{12}$ alkyl (e.g., methyl), Formula 6 wherein $R_{10}$ and $R_{11}$ are each independently a $C_1$-$C_{12}$ alkyl (e.g., methyl).

In exemplary embodiments, any combination of two or more different polymers selected from the group consisting of PEDOT, PSS, PPV, MEH-PPV and PVK may be used as a material for the HTL 16. In exemplary embodiments, the HTL 16 may be formed of a monomer selected from the group consisting of N,N'-bis-(1-naphthalenyl)-N,N'-bis-phenyl-(1,1'-biphenyl)-4,4'-diamine ("NPB"), N,N'-bis(3-methylphenyl)-N,N'-diphenyl-benzidine ("TPD"), and any combinations thereof.

The HTL 16 functions to increase the service life of the QD-EL device 10 and to lower the turn-on voltage used to initiate the operation of the QD-EL device 10. The HTL 16, which is formed of a polymer, is highly resistant to harmful substances, such as oxygen and moisture. The polymer further exhibits a high resistance to crystallization in comparison to hole transport layers that are formed of small organic molecules.

In exemplary embodiments, the HTL 16 can be formed by a wet coating process such as spin coating or other similar processes. In exemplary embodiments, a PPV film is used as the HTL 16 and is formed on the first electrode 14 by spin coating. During the spin coating process a solution of a PPV precursor polymer and methanol, as the organic solvent, is spin coated onto the first electrode 14. The coating is then thermally treated at a curing temperature of about 250 to about 300° C. in either an inert atmosphere ($N_2$) or under a vacuum for about 3 hours.

In exemplary embodiments, the QD light-emitting layer 18 positioned on the HTL 16 has either a monolayer structure or a multilayer structure in which a number of the QDs are arranged. The QDs refer to particles that are small enough in size to exhibit quantum confinement effects. The QDs have a diameter of from about 1 nm to about 10 nm.

In exemplary embodiments, the QDs may be synthesized by a wet chemical process in which the QD particles are grown from a precursor material in an organic solvent. In one exemplary embodiment, the organic solvent is naturally coordinated to the surface of the QD crystals and further serves as a dispersant to control the growth of the QD crystals. In comparison to the various vapor deposition processes, such as metal organic chemical vapor deposition ("MOCVD") and molecular beam epitaxy ("MBE"), the wet chemical process is advantageous in that the QD nanoparticles may be grown in a controllable manner using easy and economical processing steps. Thus, the energy band gap of the QDs may be controlled by varying the size of the QDs, which allows the QDs to emit light of various wavelengths.

In another exemplary embodiment, the QDs may include a semiconductor material selected from the group consisting of a Group II-VI semiconductor compound, a Group III-V semiconductor compound, a Group IV-VI semiconductor compound, a Group IV element or compound, and any combination thereof.

In exemplary embodiments, the Group II-VI semiconductor compound may be selected from the group consisting of binary compounds, e.g., CdSe, CdTe, ZnS, ZnSe, ZnTe, ZnO, HgS, HgSe and HgTe, and any mixtures thereof; ternary compounds, e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe, and any mixtures thereof; and quaternary compounds, e.g., CdHgZnTe, CdZnSeS, CdZnSeTe, CdZnSTe, CdHgSeS, CdHgSeTe, CdHgSTe, HgZnSeS, HgZnSeTe and HgZnSTe, and any mixtures thereof. The Group II-VI semiconductor compound may be comprised of any combination or mixture of the foregoing compounds.

In exemplary embodiments, the Group III-V compound may be selected from the group consisting of binary compounds, e.g., GaN, GaP, GaAs, GaSb, AlN, AlP, AlAs, AlSb, InN, InP, InAs and InSb, and any mixtures thereof; ternary compounds, e.g., GaNP, GaNAs, GaNSb, GaPAs, GaPSb, AlNP, AlNAs, AlNSb, AlPAs, AlPSb, InNP, InNAs, InNSb, InPAs, InPSb and GaAlNP, and any mixtures thereof; and quaternary compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb, and any mixtures thereof. The Group III-V semiconductor compound may be comprised of any combination or mixture of the foregoing compounds.

In exemplary embodiments, the Group IV-VI compound may be selected from the group consisting of binary compounds, e.g., SnS, SnSe, SnTe, PbS, PbSe and PbTe, and any mixtures thereof; ternary compounds, e.g., SnSeS, SnSeTe, SnSTe, PbSeS, PbSeTe, PbSTe, SnPbS, SnPbSe and SnPbTe, and any mixtures thereof; and quaternary compounds, e.g., SnPbSSe, SnPbSeTe and SnPbSTe, and any mixtures thereof. The Group IV-VI semiconductor compound may include any combination or mixture of the foregoing compounds.

In exemplary embodiments, the Group IV element or compound may be selected from the group consisting of unary compounds, e.g., Si and Ge, and any mixtures thereof; and binary compounds, e.g., SiC and SiGe, and any mixtures thereof. The Group IV semiconductor compound may be comprised of any combination or mixture of the foregoing compounds.

In another exemplary embodiment, the QDs may have either a homogeneous single structure or a core-shell double structure. In one exemplary embodiment, the core and the shell of the core-shell double structure may include semiconductor compounds selected from the above-mentioned semiconductor compounds. In exemplary embodiments, the semiconductor compounds of the core and the shell may be the same compound or different compounds. In one exemplary embodiment, the energy band gap of the shell material may be greater than the energy band gap of the core material. In one exemplary embodiment, the CdSe/ZnS QDs having a core-shell double structure are prepared by the following procedure.

In one exemplary embodiment, first, the precursor materials (e.g., dimethyl cadmium (($CH_3$)$_2$Cd) and trioctylphosphine selenide ("TOPSe")), which correspond to the core material (CdSe), are introduced into an organic solvent containing trioctylphosphine oxide ("TOPO") as the surfactant used to induce the formation of the core crystals. The core crystals are allowed to grow to a uniform size at a high temperature for a specific time. Thereafter, the precursor materials, which correspond to the shell material (ZnS), are introduced into the core crystals to form outer shells on the surfaces of the core crystals. As a result, the CdSe/ZnS QDs are capped with the TOPO.

In exemplary embodiments, the band gap of the QDs may be controlled by substituting or modifying the ligands present on the surfaces of the QDs. In one exemplary embodiment, the surface modification of the QDs may be accomplished by adding an excess of a surfactant to the QDs, followed by mild annealing of the QDs. In another exemplary embodiment, two different solvents are used to modify the surfaces of the QDs. In this exemplary embodiment, the modified QDs are then transferred to and separated in another solvent. However, in the above two methods for modifying the surfaces of the QDs, the QDs either fail to undergo complete surface modification or tend to aggregate, which results in a large loss of the QDs. In addition, the QDs may be oxidized or may have defects on the surfaces thereof, which leads to a reduction in the luminescence efficiency of the QDs. Furthermore, the above surface modification methods require the use of solvents that are capable of simultaneously dissolving both the QDs and the surfactant, which limits the type of surfactant that may be used.

In contrast, in one exemplary embodiment, the QD light-emitting layer 18 is formed by forming a QD coating and then modifying the surface of the QD coating. An exemplary embodiment of the formation procedure for forming the QD light-emitting layer 18 will be explained in detail with reference to FIGS. 2a and 2b. In one exemplary embodiment, first, a colloidal solution containing the QDs 105 is coated by a relatively simple wet process, such as spin coating, dip coating, printing, spray coating or another similar process, to form a QD coating 18'. In the QD coating 18' the first organic ligands 103 are arranged on the surfaces of QD cores 101 (S1 of FIG. 2b).

Figure 2A:
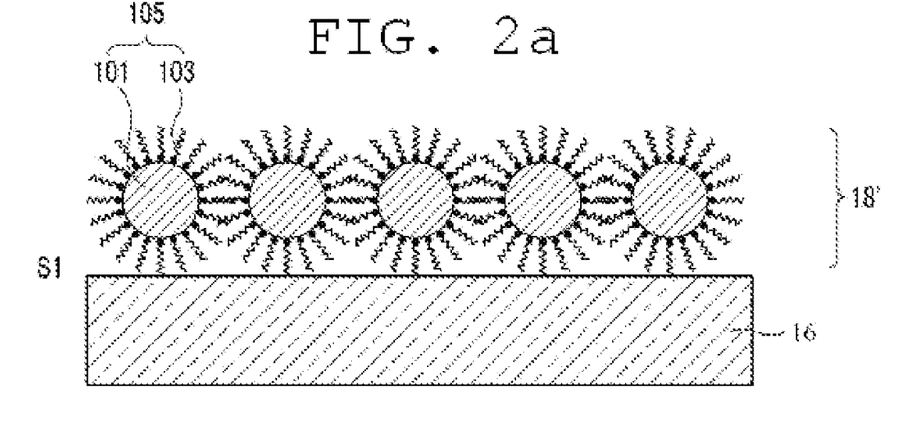
FIG. 2a is a schematic diagram illustrating an exemplary embodiment of a method for forming the quantum dot ("QD") light-emitting layer of an exemplary embodiment of a QD-EL device.
Figure 2B:
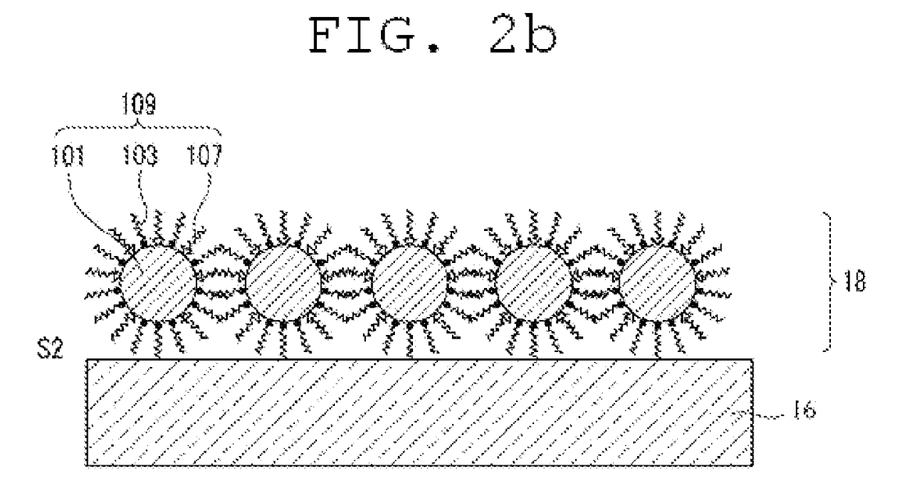
FIG. 2b is a schematic diagram illustrating an exemplary embodiment of a method for forming the quantum dot ("QD") light-emitting layer of an exemplary embodiment of a QD-EL device.

In one exemplary embodiment, the colloidal solution containing the QDs is prepared by mixing an organic solvent, a first surfactant and a cationic precursor. The mixture is then heated and an anionic precursor is introduced into the mixture while maintaining a constant reaction temperature. No particular limitations are imposed on the preparation methods of the colloidal solution. In one exemplary embodiment, the first surfactant is the source of the first organic ligands 103 that constitute the QD coating 18'.

Exemplary embodiments of the organic solvent includes the $C_6$-$C_{22}$ primary alkylamines, the $C_6$-$C_{22}$ secondary alkylamines and the $C_6$-$C_{22}$ tertiary alkylamines; the $C_6$-$C_{22}$ primary alcohols, the $C_6$-$C_{22}$ secondary alcohols and the $C_6$-$C_{22}$ tertiary alcohols; the $C_6$-$C_{22}$ ketones and the $C_6$-$C_{22}$ esters; the $C_6$-$C_{22}$ heterocyclic compounds containing at least one nitrogen or sulfur atom; the $C_6$-$C_{22}$ alkanes, the $C_6$-$C_{22}$ alkenes and the $C_6$-$C_{22}$ alkynes; the trialkylphosphines, such as trioctylphosphine; the trialkylphosphine oxides, such as trioctylphosphine oxide; and any combinations thereof.

In another exemplary embodiment, the first surfactant may be a compound represented by Formula 7:

$$X_1\text{-}Q_1 \quad \quad \text{Formula 7}$$

wherein $X_1$ is a functional group including at least one group selected from the group consisting of acid groups and functional groups, wherein the acid groups and the functional groups contain at least one element of N, O, P, F, Cl and S, and wherein $Q_1$ is a hydrocarbon group.

Exemplary embodiments of $X_1$ include N, NO, $NO_2$, NH, $NH_2$, $NH_3$, COOH, CO, $CO_2$, P, POOH, P=O, $PO_2$, $PO_3$, S, SOOH, SH, SO, $SO_2$, $SO_3$, CN, F and Cl. Exemplary embodiments of $Q_1$ include a $C_3$-$C_{20}$ substituted or unsubstituted alkyl and a $C_6$-$C_{30}$ substituted or unsubstituted aryl. The substituted alkyl is an alkyl that is substituted with at least one substituent selected from the group consisting of an alkyl, an aryl and a halogen. The substituted aryl is an aryl that is substituted with at least one substituent selected from the group consisting of an alkyl, an aryl and a halogen.

In another exemplary embodiment, the cationic precursor for forming the cathode may be a precursor of a Group II element such as Zn, Cd or Hg, a precursor of a Group III element such as Al, Ga, In or Ti, or a precursor of a Group IV element such as Si, Ge, Sn or Pb. In another exemplary embodiment, the anionic precursor may be a precursor of a Group V element such as P, As, Sb or Bi, or a precursor of a Group VI element such as O, S, Se or Te. Any combination of the foregoing anionic and cationic precursors may be used. Other cationic and anionic precursors may be selected depending on the constituent elements of the QDs.

In another exemplary embodiment, each of the cationic and anionic precursors may be a carboxylate, a carbonate, a halide, a nitrate, a phosphate or a sulfate of the corresponding element.

In exemplary embodiments, the QD coating 18' is formed by coating the colloidal solution containing QDs onto either the HTL or the ETL. In one exemplary embodiment, the QD coating 18' includes the QD cores 101 and the first organic ligands 103 distributed onto the surfaces of the QD cores 101. In one exemplary embodiment, the first organic ligands 103 are derived from the first surfactant used in the synthesis of the QDs.

Then, in exemplary embodiments, the QD light-emitting layer 18 is formed by modifying the QD coating 18' with a surface modifying composition that includes a second surfactant. As a result of the surface modification, the second organic ligands 107 are formed on the surfaces of the QD cores 101. In exemplary embodiments, the second organic ligands 107 are derived from the second surfactant.

In one exemplary embodiment, the second surfactant may be present at a concentration of about 5 to about 100 mM in the surface modifying composition. In exemplary embodiments, the surface modifying composition may be prepared by dispersing the second surfactant into a suitable solvent. In exemplary embodiments, the solvent is an organic solvent. In one exemplary embodiment, the solvent may be an alcoholic solvent such as methanol, ethanol, isopropyl alcohol, or any combination thereof. Any solvent that is capable of dispersing the second surfactant may be used without limitation. Since the solvent does not have to completely dissolve the QDs, the choice of the solvent is not restrictive. Therefore, the second surfactant may be selected from various types of surfactants.

In exemplary embodiments, any suitable coating process may be used to coat the surface modifying composition. Non-limiting examples of the coating process include dip coating, spin coating, printing, spray coating and other similar processes.

In one exemplary embodiment, the coating process is dip coating. In the case of dip coating, the QD coating 18' is dipped into the surface modifying composition at from about room temperature to about 70° C. for a duration of about 30 seconds to about 24 hours.

In one exemplary embodiment, the coating process is spin coating. In the case of spin coating, the surface modifying composition is coated onto the QD coating 18' while the substrate 12 is rotated at about 300 to about 5,000 rpm for a duration of about 15 seconds to about 2 minutes. In exemplary embodiments, the spin coating may be repeated from about one to about twenty times.

In one exemplary embodiment, the coating process is spray coating. In the case of spray coating, the surface modifying composition is sprayed onto the QD coating 18' for a duration of about 5 seconds to about 2 hours while adjusting the temperature of the substrate 12 to from about 0 to about 200° C.

After applying the coating, in exemplary embodiments, the QD light-emitting layer 18 may be washed with alcohol to remove any impurities present therein.

In another exemplary embodiment, the second surfactant, which may function as the source of the second organic ligands 107, may be represented by Formula 8:

X-Q            Formula 8 wherein X is a functional group including at least one group selected from the group consisting of acid groups and highly electronegative electron withdrawing groups, wherein the acid groups and the electron withdrawing groups contain at least one element of N, O, P, F, Cl and S, with the proviso that X is different from $X_1$ of the first surfactant of Formula 7 which provides the first organic ligands to the QDs, and wherein X has a higher electronegativity than $X_1$, and wherein Q is a hydrocarbon group.

Exemplary embodiments of X include N, NO, $NO_2$, NH, $NH_2$, $NH_3$, COOH, CO, $CO_2$, P, POOH, P=O, $PO_2$, $PO_3$, S, SOOH, SH, SO, $SO_2$, $SO_3$, CN, F and Cl. Exemplary embodiments of Q include a $C_3$-$C_{20}$ substituted or unsubstituted alkyl and a $C_6$-$C_{30}$ substituted or unsubstituted aryl. The substituted alkyl is an alkyl that is substituted with at least one substituent selected from the group consisting of an alkyl, an aryl and a halogen. The substituted aryl is an aryl that is substituted with at least one substituent selected from the group consisting of an alkyl, an aryl and a halogen.

Exemplary embodiments of the second surfactant of Formula 8 include oleic acid, stearic acid, palmitic acid, hexylphosphonic acid, n-octylphosphonic acid, tetradecylphosphonic acid, octadecylphosphonic acid, alkylamines (e.g., n-octylamine, hexadecylamine and heptylamine), alkanethiols (e.g., octanethiol), and any combination of the foregoing.

In another exemplary embodiment, the second surfactant may be represented by Formula 9:

X-Q-Y            Formula 9 wherein X and Q are as defined in Formula 8 and Y is a functional group including at least one group selected from the group consisting of acid groups and highly electronegative electron withdrawing groups, wherein the acid groups and the electron withdrawing groups contain at least one element of N, O, P, F, Cl and S, with the proviso that X and Y are different from $X_1$ of the first surfactant of Formula 7, which provides the first organic ligands to the QDs, and wherein each of X and Y has a higher electronegativity than $X_1$ and wherein X is different from Y.

Exemplary embodiments of Y include N, NO, $NO_2$, NH, $NH_2$, $NH_3$, COOH, CO, $CO_2$, P, POOH, P=O, $PO_2$, $PO_3$, S, SOOH, SH, SO, $SO_2$, $SO_3$, CN, F and Cl.

In exemplary embodiments, the surfaces of the QDs 105 are modified by substituting a portion of the first organic ligands 103 of the QD coating 18' with the second surfactant of Formula 8 or 9. In exemplary embodiments, since the surface of the already formed QD coating 18' is modified by the second surfactant under different circumstances for surface modification, the QD light-emitting layer 18 has a first surface and a second surface. The first surface underlies the QD cores 101 and is in contact with the hole transport layer. The second surface overlies the QD cores 101 and is in contact with the ETL in the subsequent step. In this exemplary embodiment, the second surface is more exposed to the second surfactant 107 than the first surface. Therefore, the first organic ligands 103 that are present in the second surface are more substituted with the second organic ligands 107 than the first organic ligands 103 that are present in the first surface to form the QDs 109 having different organic ligand distributions in the first surface and the second surface of the QD light-emitting layer 18. Since the first surface and the second surface of the QD light-emitting layer 108 includes the QDs 109 having different organic ligand distributions, the structure of the QD light-emitting layer 108 is asymmetric.

In exemplary embodiments, the highly electronegative electron withdrawing groups X and Y present in the second surfactants of Formulas 8 and 9 are positioned on the surfaces of the QD cores 101 of the QD light-emitting layer 18. The electron withdrawing groups affect the electron density distribution of the QD light-emitting layer 18, which results in a change in the valence band level of the QD light-emitting layer. In exemplary embodiments, X and Y induce the polarity of the QD light-emitting layer 18 such that it lowers the energy barrier at the interface between the QD light-emitting layer 18 and the HTL or the ETL ETL, which facilitates the transport of carriers. In one exemplary embodiment, when the second surfactant of Formula 9 having different terminal ligands is used to modify the surfaces of the QDs 105, the polarity of the QD light-emitting layer 18 may be induced more significantly.

In exemplary embodiments, the asymmetric organic ligand distribution of the QD light-emitting layer 18 may shift the band position of the QD light-emitting layer 18, which results in an increase in the band level. In one exemplary embodiment, the asymmetric organic ligand distribution considerably reduces the band offset between the valence band level of the QD light-emitting layer 18 and the highest occupied molecular orbital ("HOMO") level of the hole transport layer, thereby achieving a low turn-on voltage, a low operating voltage and a high efficiency for the QD-EL device.

In one exemplary embodiment of the QD light-emitting layer 18 (S2 of FIG. 2b), the first organic ligands and the second organic ligands are distributed onto the surfaces of the QD cores 101. The first surface and the second surface of the QD light-emitting layer 18 are in contact with the HTL and the ETL, respectively. In one exemplary embodiment, the first surface and the second surface each have a different organic ligand distribution. In another exemplary embodiment, the electronegativity of the second surface of the QD light-emitting layer, which is in contact with the ETL, may be higher than that of the first surface of the QD light-emitting layer, which is in contact with the HTL. In another exemplary embodiment, the difference in the electronegativity between the first surface and the second surface of the QD light-emitting layer may be from about 0.1 to about 3.7. In exemplary embodiments, the adjustment of the electronegativity difference to the range defined above may contribute to a further improvement in the efficiency of the device.

In exemplary embodiments, annealing may make the QD light-emitting layer 18 more stable. In one exemplary embodiment, the annealing may be carried out at a temperature of from about 60 to about 240° C. for a duration of from about 5 minutes to about 24 hours.

In exemplary embodiments, the surface modification occurs in a simple manner, which enables the formation of the QD light-emitting layer 18 from the QD coating 18' without the loss of the QDs.

In exemplary embodiments, a wide variety of materials may be used for the formation of the ETL 20 on the QD light-emitting layer 18. In one embodiment the material may include inorganic materials. Exemplary embodiments of the inorganic materials include metal oxides such as $TiO_2$ and $ZrO_2$, and n-type semiconductor polymers. In other exemplary embodiments, the ETL 20 is formed of an inorganic or a polymeric material rather than from small organic molecules that are susceptible to harmful substances (e.g., moisture and oxygen), which prevents the structural degradation of the electroluminescent device due to oxidation or corrosion. In one exemplary embodiment, a material having a low threshold voltage that is comparable to the threshold voltage of the small organic molecules is used for the formation of the ETL 20. The material having a low threshold voltage therefore maintains the turn-on voltage of the QD-EL device at a low level, which is similar to the levels of known organic light-emitting diodes ("OLEDs").

In exemplary embodiments, the ETL 20 14 may be formed by a vacuum evaporation process; a dry deposition process such as sputtering, plasma plating or ion plating, a wet deposition process such as spin coating, dipping or flow coating; or by other similar processes.

In another exemplary embodiment, the cathode formed on the ETL 20 may be made of a material having a low work function in order to facilitate the injection of electrons into the ETL 20. Exemplary embodiments of the low work function material include, but are not limited to, metals, such as magnesium, calcium, sodium, potassium, titanium, indium, yttrium, lithium, gadolinium, aluminum, silver, tin, lead, cesium, barium, alloys thereof, and mixtures thereof; and multilayer materials, such as LiF/Al, $LiO_2$/Al, LiF/Ca, LiF/Al and $BaF_2$/Ca. The second electrode 22 may be made by a dry deposition process such as sputtering or other similar processes.

A more detailed description of exemplary embodiments will be described with reference to the following examples. However, these examples are given merely for the purpose of illustration and are not to be construed as limiting the scope of the exemplary embodiments.

EXAMPLES

Preparative Example 1

Preparation of the Colloidal Solution Containing the QDs

A CdO powder (1.6 mmol, 0.206 g; Aldrich, +99.99%) is mixed with oleic acid (6.4 mmol, 1.8 g; Aldrich, 95%) in 40 mL of trioctylamine ("TOA", Aldrich, 95%). The mixed solution is thermally treated at 150° C. with rapid stirring and is then heated to 300° C. under a stream of $N_2$ gas. Next, 0.2 mL of trioctylphosphine ("TOP", Strem, 97%) containing 2.0 M Se (Alfa Aesar) is rapidly introduced into the Cd-containing mixture at 300° C. After 90 seconds, 1.2 mmol of n-octanethiol in TOA (210 μl in 6 mL) is injected at a rate of 1 mL/min using a syringe pump. The mixture is allowed to react for 40 minutes.

Next, 0.92 g of zinc acetate and 2.8 g of oleic acid are dissolved in 20 mL of TOA at a temperature of 200° C. under a nitrogen atmosphere to prepare a 0.25 M Zn precursor solution. After heating to a temperature of 100° C., a 16 mL aliquot of the Zn-oleic acid solution is injected into the Cd-containing reaction medium at a rate of 2 mL/min. Then, 6.4 mmol of the n-octanethiol in TOA (1.12 mL in 6 mL) is injected at a rate of 1 mL/min using a syringe pump. The reaction is carried out for a total of 2 hours. After completion of the reaction, the crude product is then cooled to a temperature of about 50 to about 60° C., followed by centrifugation (5,600 rpm) to remove any organic sludge. Ethanol (Fisher, high performance liquid chromatography "HPLC" grade) is then added until the opaque mass is dissolved, followed by centrifugation. The precipitate is then dissolved in toluene (Sigma-Aldrich, anhydrous 99.8%) to prepare a colloidal solution of the CdSe/CdS/ZnS core-shell QDs.

Preparative Example 2

Preparation of the Surface Modifying Composition

Heptylamine is added at a concentration of 20 mM to methanol as the solvent in order to prepare a surface modifying composition.

Identification of Surface Modification of the QD Light-Emitting Layer

Figure 3:
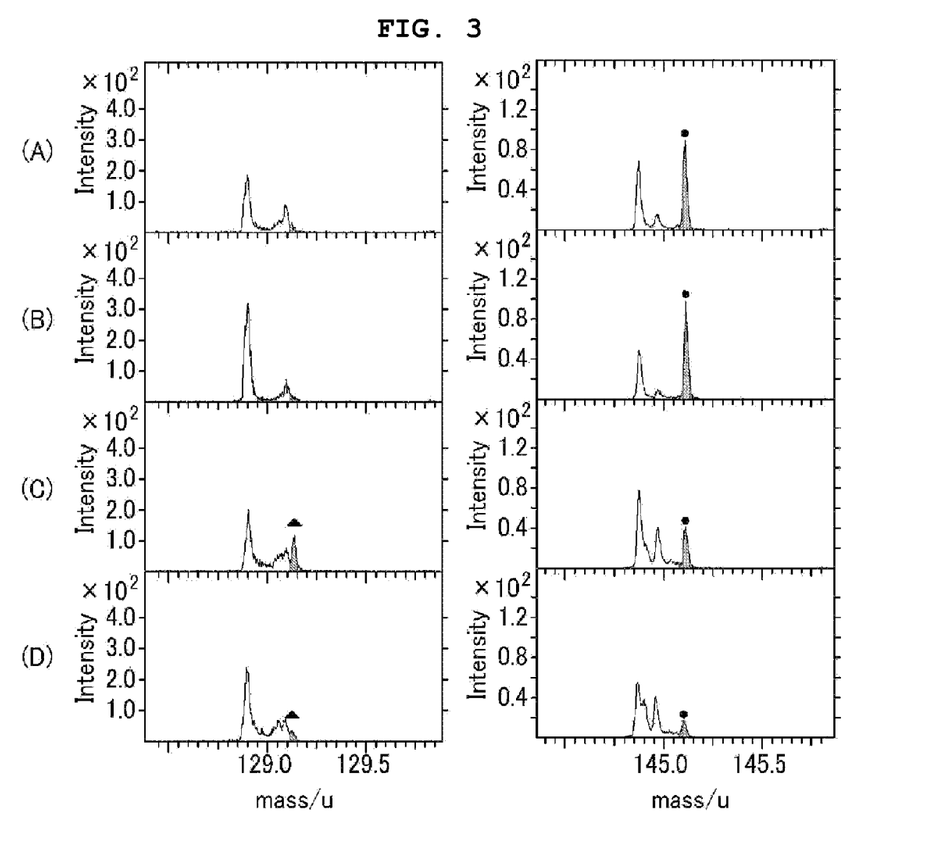
FIG. 3 is a graph illustrating intensity ($\times 10^2$) versus mass/u of the results of the secondary ion mass spectrometry ("SIMS") for (A) a QD coating before surface modification, (B) the QD coating after annealing, (C) a QD light-emitting layer after surface modification and (D) the QD light-emitting layer after a series of surface modification and annealing at 180° C.

The colloidal solution containing the QDs prepared in Preparative Example 1 is spin-coated onto a silicon wafer to form a QD coating. The surface modifying composition of Preparative Example 2 is then spin-coated onto the QD coating while rotating the silicon wafer at a rate of 2,000 rpm to modify the surfaces of the QDs. The surface modification results in a QD light-emitting layer. The QD coating before surface modification (A), the QD coating after annealing (B), the QD light-emitting layer after surface modification (C) and the QD light-emitting layer after a series of surface modifications and annealing at 180° C. (D) are each analyzed using time-of-flight secondary ion mass spectrometry ("ToF-SIMS"). The results are shown in FIG. 3. In FIG. 3, the dot-symbol "●" and the triangle-symbol "▲" represent the results for the n-octanethiol ligands and the heptylamine ligands used for surface modification, respectively. No peaks corresponding to heptylamine are detected in (A) and (B) of FIG. 3, demonstrating that the QD coating does not undergo surface modification. Peaks corresponding to heptylamine are detected in each of (C) and (D) of FIG. 3, demonstrating that the QD coating has undergone the surface modification.

Identification of Shift in the Band Level of the QD Light-Emitting Layer

The colloidal solution containing the QDs that is prepared in Preparative Example 1 is spin-coated onto a silicon wafer to form a QD coating. The silicon wafer is then dipped into the surface modifying composition of Preparative Example 2 at 60° C. for 15 minutes in order to modify the surfaces of the QDs. The surface modification gives a QD light-emitting layer. The ionization potentials of the QD coating before surface modification (A), the QD coating after annealing without undergoing surface modification (B), the QD light-emitting layer after surface modification (C), the QD light-emitting layer after a series of surface modification and annealing at 80° C. (D) and the QD light-emitting layer after a series of surface modification and annealing at 180° C. (E) are each measured by He (II) ultraviolet "UV" photoelectron spectroscopy. The results are shown below in Table 1.

TABLE 1

| Quantum dot coating/Quantum dot light-emitting layer | Secondary cutoff ($E_{s,cutoff}$, eV) | Valence band edge ($E_{v,cutoff}$, eV) | Ionization potential (eV) |
| --- | --- | --- | --- |
| (A) | 36.59 | 2.63 | 6.85 |
| (B) | 36.67 | 2.70 | 6.84 |
| (C) | 35.77 | 1.21 | 6.25 |
| (D) | 35.90 | 1.33 | 6.23 |
| (E) | 35.55 | 0.96 | 6.23 |

As can be seen from the results in Table 1, the ionization potentials of the QD light-emitting layers (C), (D) and (E) after surface modification are shifted by 0.6 eV to a lower energy than the QD coatings (A) and (B) before surface modification.

Figure 4:
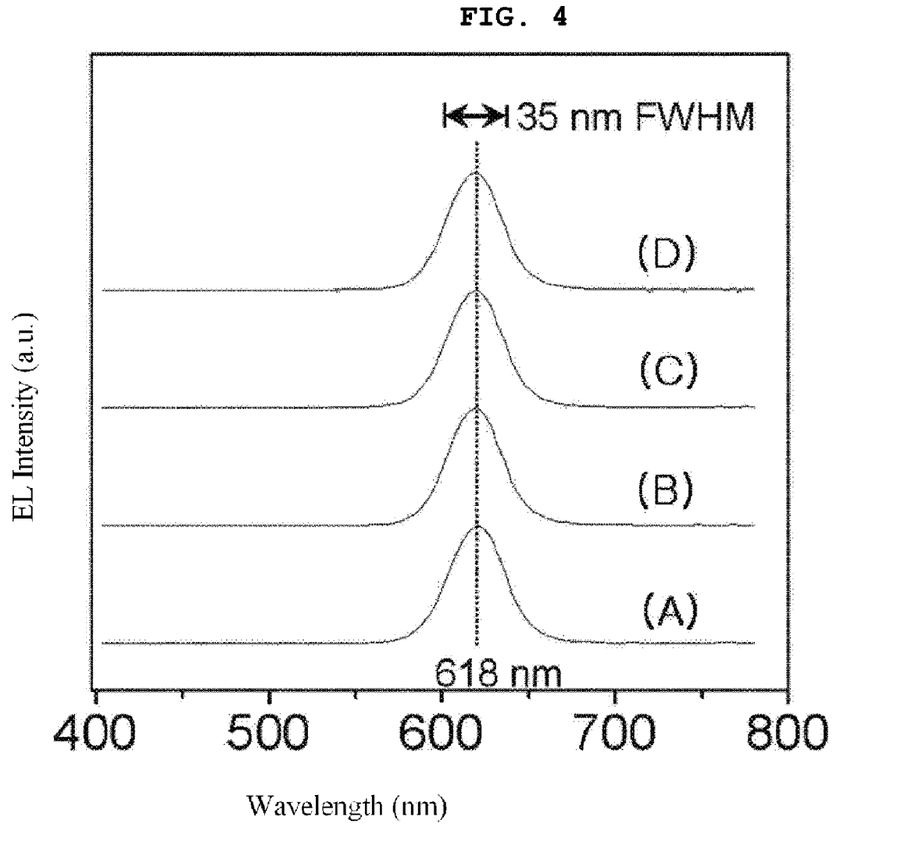
FIG. 4 is a graph illustrating electroluminescence ("EL") intensity (a.u.) versus wavelength (nm) for the photoluminescence ("PL") intensities of (A) a QD coating before surface modification, (B) the QD coating after annealing, (C) a QD light-emitting layer after surface modification and (D) the QD light-emitting layer after a series of surface modification and annealing at 180° C.

Identification of Variations in the Emission Wavelength:

The colloidal solution containing the QDs as prepared in Preparative Example 1 is spin-coated onto a silicon wafer to form a QD coating. The silicon wafer is then dipped into the surface modifying composition of Preparative Example 2 at 60° C. for 15 minutes in order to modify the surfaces of the QDs. The surface modification results in a QD light-emitting layer. The photoluminescence ("PL") intensities of the QD coating before surface modification (A), the QD coating after annealing without undergoing surface modification (B), the QD light-emitting layer after surface modification (C) and the QD light-emitting layer after a series of surface modification and annealing at 180° C. (D) are each measured, and the results are shown in FIG. 4. The graph of FIG. 4 shows that there are no changes in the PL peak position of the QD coatings or in the QD light-emitting layers before and after surface modification. This reveals that the band gap of the QDs is not changed by surface modification.

Example 1

Fabrication of the QD-EL Device

After an ITO anode is formed on the surface of a glass substrate, a PEDOT HTL is formed on the anode. Poly[(9,9-dioctylfluorenyl-2,7-diyl)-co-(4,4'-(N-(4-sec-butylphenyl)) diphenylamine)] ("TFB") is coated onto the PEDOT HTL that is rotating at a rate of 2,000 rpm inside a glove box. The PEDOT HTL is then thermally treated at 180° C. for 30 minutes to form a 20 nm thick HTL. Then, the colloidal solution containing the QDs as prepared in Preparative Example 1 is spin-coated onto the HTL to form a QD coating. The QD coating is then dipped into the surface modifying composition of Preparative Example 2 at 60° C. for 15 minutes to modify the surface of the HTL. The surface modification gives a QD light-emitting layer. A $TiO_2$ ETL and an Al cathode are formed sequentially on the QD light-emitting layer to complete the fabrication of a QD-EL device.

Example 2

Fabrication of QD-EL Device

After an ITO anode is formed on the surface of a glass substrate, a PEDOT HTL is formed on the anode. Poly[(9,9-dioctylfluorenyl-2,7-diyl)-co-(4,4'-(N-(4-sec-butylphenyl)) diphenylamine)] ("TFB") is coated onto the PEDOT HTL that is rotating at a rate of 2,000 rpm inside a glove box. The PEDOT HTL is then thermally treated at 180° C. for 30 minutes to form a 20 nm thick HTL. Then, the colloidal solution containing the QDs as prepared in Preparative Example 1 is spin-coated onto the HTL to form a QD coating. The QD coating is then dipped into the surface modifying composition of Preparative Example 2 at 60° C. for 15 minutes, and then annealed at 180° C. to modify the surface of the HTL. The surface modification gives a QD light-emitting layer. A $TiO_2$ ETL and an Al cathode are formed sequentially on the QD light-emitting layer to complete the fabrication of a QD-EL device.

Comparative Example 1

Fabrication of the QD-EL Device

A QD-EL device is fabricated in the same manner as in Example 1, except that a QD light-emitting layer is formed by spin coating the colloidal solution of Preparative Example 1 without undergoing surface modification using the surface modifying composition of Example 2.

Figure 5:
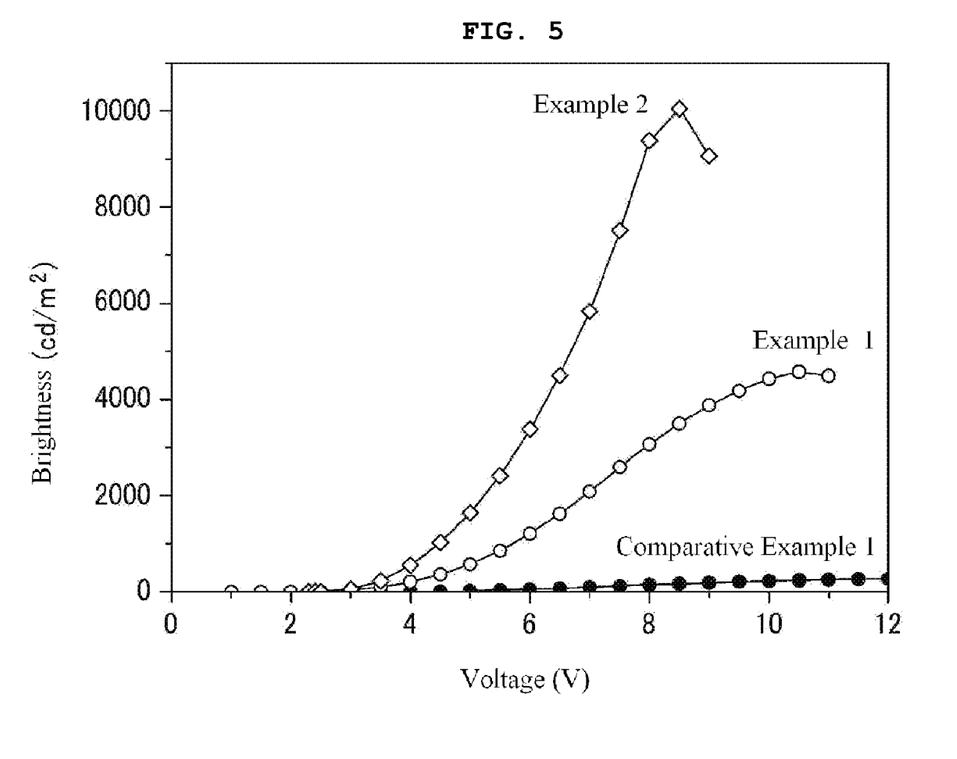
FIG. 5 is a graph illustrating brightness (cd/m2) versus voltage (V) for the variations in the brightness characteristics of the QD-EL devices prepared in accordance with Examples 1 and 2 and Comparative Example 1.

The brightness characteristics of the QD-EL devices fabricated in Examples 1 and 2 and in Comparative Example 1 are measured as a function of voltage applied to the devices, and the results are shown in FIG. 5. The maximum brightness and the luminescence efficiencies of the devices are summarized in Table 2.

TABLE 2

| | Maximum brightness ($cd/m^2$) | Luminescence efficiency (cd/A) |
|---|---|---|
| Example 1 | 4,572 | 0.90 |
| Example 2 | 10,040 | 2.53 |
| Comparative Example 1 | 266 | 0.02 |

The results in Table 2 show that the QD-EL devices of Examples 1 and 2 exhibit excellent characteristics in terms of brightness and efficiency over the QD-EL device of Comparative Example 1.

As is apparent from the above description, in the exemplary embodiments of the QD-EL device, the QD light-emitting layer has a first surface in contact with the HTL and a second surface in contact with the ETL, and the first surface has an organic ligand distribution that is different from the organic ligand distribution of the second surface. Due to the different organic ligand distributions, the band level of the QD light-emitting layer is controlled such that a difference in the energy between the valence band levels of the QD light-emitting layer and the HOMO level of the HTL is minimized. Therefore, the exemplary embodiments of the QD-EL device have a low turn-on voltage and a low operating voltage while exhibiting high brightness and high luminescence efficiency.

Although exemplary embodiments have been described herein with reference to the foregoing exemplary embodiments, those skilled in the art will appreciate that various modifications and changes are possible without departing from the spirit of the invention as disclosed in the accompanying claims. Therefore, it is to be understood that such modifications and changes are encompassed within the scope of the invention.

What is claimed is:
1. A quantum dot electroluminescent device comprising:
a substrate;
a quantum dot light-emitting layer disposed on the substrate;
a first electrode which injects charge carriers into the quantum dot light-emitting layer;
a second electrode which injects charge carriers, which have an opposite charge than the charge carriers injected by the first electrode, into the quantum dot light-emitting layer;
a hole transport layer disposed between the first electrode and the quantum dot light-emitting layer; and
an electron transport layer disposed between the second electrode and the quantum dot light-emitting layer;

wherein the quantum dot light-emitting layer has a first surface in contact with the hole transport layer and a second surface in contact with the electron transport layer, wherein the quantum dot light-emitting layer comprises:
   a plurality of first organic ligands distributed on the first surface and the second surface; and
   a plurality of second organic ligands distributed on the first surface and the second surface; and wherein a distribution of the first and second organic ligands on the first surface is different from a distribution of the first and second organic ligands on the second surface.

2. The quantum dot electroluminescent device of claim 1, wherein the quantum dot light-emitting layer comprises a plurality of quantum dots comprised of a semiconductor material selected from the group consisting of a Group II-VI semiconductor compound, a Group III-V semiconductor compound, a Group IV-VI semiconductor compound, a Group IV element or compound and any combinations thereof.

3. The quantum dot electroluminescent device of claim 2, wherein the Group II-VI semiconductor compound is selected from the group consisting of CdSe, CdTe, ZnS, ZnSe, ZnTe, ZnO, HgS, HgSe and HgTe as binary compounds and any mixtures thereof; CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe as ternary compounds and any mixtures thereof; and CdHgZnTe, CdZnSeS, CdZnSeTe, CdZnSTe, CdHgSeS, CdHgSeTe, CdHgSTe, HgZnSeS, HgZnSeTe and HgZnSTe as quaternary compounds and any mixtures thereof;

wherein the Group III-V compound is selected from the group consisting of GaN, GaP, GaAs, GaSb, AlN, AlP, AlAs, AlSb, InN, InP, InAs and InSb as binary compounds and any mixtures thereof; GaNP, GaNAs, GaNSb, GaPAs, GaPSb, AlNP, AlNAs, AlNSb, AlPAs, AlPSb, InNP, InNAs, InNSb, InPAs, InPSb and GaAlNP as ternary compounds and any mixtures thereof; and GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb as quaternary compounds and any mixtures thereof;

wherein the Group IV-VI compound is selected from the group consisting of SnS, SnSe, SnTe, PbS, PbSe and PbTe as binary compounds and any mixtures thereof; SnSeS, SnSeTe, SnSTe, PbSeS, PbSeTe, PbSTe, SnPbS, SnPbSe and SnPbTe as ternary compounds and any mixtures thereof; and SnPbSSe, SnPbSeTe and SnPbSTe as quaternary compounds and any mixtures thereof; and wherein the Group IV element or compound is selected from the group consisting of Si and Ge as unary compounds and any mixtures thereof; and SiC and SiGe as binary compounds and any mixtures thereof.

4. The quantum dot electroluminescent device of claim 1, wherein the quantum dot light-emitting layer comprises a plurality of quantum dot cores, each of the plurality of quantum dot cores including:
   a surface;
   at least one first organic ligand of the plurality of first organic ligands, wherein the at least one first organic ligand is disposed on the surface; and
   at least one second organic ligand of the plurality of second organic ligands, wherein the at least one second organic ligand is disposed on the surface,
   wherein the second surface of the quantum dot light-emitting layer in contact with the electron transport layer has a higher electronegativity than the first surface thereof in contact with the hole transport layer.

5. The quantum dot electroluminescent device of claim 4, wherein the difference in electronegativity between the first surface and the second surface of the quantum dot light-emitting layer is from about 0.1 to about 3.7.

* * * * *